(12) United States Patent
Cantwell et al.

(10) Patent No.: US 12,253,476 B2
(45) Date of Patent: *Mar. 18, 2025

(54) MULTI-LEVEL RF PULSE MONITORING AND RF PULSING PARAMETER OPTIMIZATION AT A MANUFACTURING SYSTEM

(71) Applicant: Applied Materials, Inc., Santa Clara, CA (US)

(72) Inventors: Dermot Cantwell, Sunnyvale, CA (US); Quentin Ernie Walker, Fremont, CA (US); Serghei Malkov, Hayward, CA (US); Jatinder Kumar, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/411,609

(22) Filed: Jan. 12, 2024

(65) Prior Publication Data

US 2024/0151656 A1 May 9, 2024

Related U.S. Application Data

(63) Continuation of application No. 18/100,518, filed on Jan. 23, 2023, now Pat. No. 11,874,234, which is a
(Continued)

(51) Int. Cl.
*G01N 22/00* (2006.01)
*G01N 22/02* (2006.01)
(Continued)

(52) U.S. Cl.
CPC ............ *G01N 22/00* (2013.01); *G01N 22/02* (2013.01); *G01N 22/04* (2013.01); *G01R 27/06* (2013.01); *G01R 27/28* (2013.01); *G01R 27/32* (2013.01)

(58) Field of Classification Search
CPC ........ G01N 22/00; G01N 22/02; G01N 22/04; G01R 27/06; G01R 27/28; G01R 27/32
(Continued)

(56) References Cited

U.S. PATENT DOCUMENTS 9,368,329 B2   6/2016  Valcore, Jr. et al.
9,788,405 B2   10/2017  Kawasaki et al.
(Continued)

FOREIGN PATENT DOCUMENTS

WO    2017058341 A1    4/2017

OTHER PUBLICATIONS

International Search Report and Written Opinion for International Application No. PCT/US2022/051441, mailed Apr. 24, 2023, 14 Pages.

*Primary Examiner* — Raul J Rios Russo
(74) *Attorney, Agent, or Firm* — Lowenstein Sandler LLP

(57) ABSTRACT

Methods and systems for RF pulse monitoring and RF pulsing parameter optimization at a manufacturing system are provided. Sensor data is received from one or more sensors that indicates an RF pulse waveform detected within the processing chamber. One or more RF signal characteristics are identified in the detected RF pulse waveform. Each identified RF signal characteristic corresponds to at least one RF signal pulse of the RF signal pulsing within the processing chamber. A determination is made, based on the identified one or more RF signal characteristics, whether the detected RF pulse waveform corresponds to the target RF pulse waveform. An indication of whether the detected RF pulse waveform corresponds to the target RF pulse waveform is provided to a client device.

20 Claims, 8 Drawing Sheets

Related U.S. Application Data continuation of application No. 17/547,117, filed on Dec. 9, 2021, now Pat. No. 11,585,764.

(51) Int. Cl.
| | | |
|---|---|---|
| *G01N 22/04* | (2006.01) | |
| *G01R 27/06* | (2006.01) | |
| *G01R 27/28* | (2006.01) | |
| *G01R 27/32* | (2006.01) | |

(58) Field of Classification Search
USPC .......... 324/76.11–76.83, 459, 600, 629, 637
See application file for complete search history.

(56) References Cited

U.S. PATENT DOCUMENTS

| | | |
|---|---|---|
| 2013/0214828 A1 | 8/2013 | Valcore, Jr. et al. |
| 2015/0177164 A1 | 6/2015 | Patterson et al. |
| 2016/0268100 A1* | 9/2016 | Valcore, Jr. ........ H01J 37/32183 |
| 2017/0099722 A1* | 4/2017 | Kawasaki ................ H05H 1/46 |
| 2017/0176349 A1 | 6/2017 | Gopalan et al. |
| 2018/0017507 A1 | 1/2018 | Libman et al. |
| 2018/0372656 A1 | 12/2018 | Ben et al. |
| 2019/0064081 A1* | 2/2019 | Richardson ........ G01R 29/0821 |
| 2020/0335305 A1* | 10/2020 | Long ................ H01J 37/32128 |
| 2022/0254608 A1* | 8/2022 | Long ................ H01J 37/32146 |

* cited by examiner

MULTI-LEVEL RF PULSE MONITORING AND RF PULSING PARAMETER OPTIMIZATION AT A MANUFACTURING SYSTEM

RELATED APPLICATIONS

The present application is a continuation of application Ser. No. 18/100,518, filed Jan. 23, 2023, which is a continuation of application Ser. No. 17/547,117, filed Dec. 9, 2021, the contents of which are incorporated by reference herein.

TECHNICAL FIELD

Embodiments of the present disclosure relate, in general, to manufacturing systems and more particularly to multi-level RF pulse monitoring and pulsing parameter optimization at a manufacturing system.

BACKGROUND

Products are produced by performing one or more manufacturing processes using manufacturing equipment. For example, substrate processing equipment is used to produce substrates by transporting substrates to processing chambers and performing one or more process operations on the substrates in the processing chambers.

A substrate process (e.g., an etch process, a deposition process, etc.) can be performed for a substrate at a processing chamber of a manufacturing system. Each substrate process performed at the processing chamber can be performed according to a particular process recipe. In some instances, one or more operations of a process recipe can include pulsing one or more radio frequency (RF) signals within processing chamber (e.g., via a RF generator within or coupled to the processing chamber). For example, a user of the manufacturing system (e.g., an operator, a technician, etc.) can provide one or more RF pulsing parameters (e.g., pulsing duty cycle parameter, a pulsing bias shift parameter, etc.) via a client device connected to the manufacturing system and one or more RF generators at the manufacturing system can pulse the RF signal(s) within the processing chamber according to the one or more provided RF pulsing parameter. It can be difficult for a user of the manufacturing system to tune RF pulsing parameters to cause a target multi-level RF pulse waveform to be generated in the processing chamber, in accordance with a substrate process recipe.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes pulsing a radio frequency (RF) signal within a processing chamber of a manufacturing system in accordance with a set of RF pulsing parameters. The set of RF pulsing parameters correspond to a target multi-level RF pulse waveform to be generated within the processing chamber based on the RF signal pulsing by one or more RF generators associated with the processing chamber. The method further includes receiving, from one or more sensors associated with the processing chamber, sensor data indicating a multi-level RF pulse waveform detected within the processing chamber based on the RF signal pulsing. The method further includes identifying one or more peaks in the detected multi-level RF pulse waveform. Each of the identified one or more peaks correspond to at least one RF signal pulse of the RF signal pulsing within the processing chamber. The method further includes determining, based on the identified one or more peaks, whether the detected multi-level RF pulse waveform corresponds to the target multi-level RF pulse waveform. The method further includes providing an indication of whether the detected multi-level RF pulse waveform corresponds to the target multi-level RF pulse waveform to a client device connected to the manufacturing system.

In another aspect of the disclosure, a non-transitory machine-readable storage medium stores instructions which, when executed, cause a processing device to pulse a radio frequency (RF) signal within a processing chamber of a manufacturing system in accordance with a set of RF pulsing parameters. The set of RF pulsing parameters correspond to a target multi-level RF pulse waveform to be generated within the processing chamber based on the RF signal pulsing by one or more RF generators associated with the processing chamber. The processing device is further to receive, from one or more sensors associated with the processing chamber, sensor data indicating a multi-level RF pulse waveform detected within the processing chamber based on the RF signal pulsing. The processing device is further to identify one or more peaks in the detected multi-level RF pulse waveform. Each of the identified one or more peaks correspond to at least one RF signal pulse of the RF signal pulsing within the processing chamber. The processing device is further to determine, based on the identified one or more peaks, whether the detected multi-level RF pulse waveform corresponds to the target multi-level RF pulse waveform. The processing device is further to provide an indication of whether the detected multi-level RF pulse waveform corresponds to the target multi-level RF pulse waveform to a client device connected to the manufacturing system.

In another aspect of the disclosure, a system includes a memory, and a processing device coupled to the memory. The processing device is to pulse a radio frequency (RF) signal within a processing chamber of a manufacturing system in accordance with a set of RF pulsing parameters. The set of RF pulsing parameters correspond to a target multi-level RF pulse waveform to be generated within the processing chamber based on the RF signal pulsing by one or more RF generators associated with the processing chamber. The processing device is further to receive, from one or more sensors associated with the processing chamber, sensor data indicating a multi-level RF pulse waveform detected within the processing chamber based on the RF signal pulsing. The processing device is further to identify one or more peaks in the detected multi-level RF pulse waveform. Each of the identified one or more peaks correspond to at least one RF signal pulse of the RF signal pulsing within the processing chamber. The processing device is further to determine, based on the identified one or more peaks, whether the detected multi-level RF pulse waveform corresponds to the target multi-level RF pulse waveform. The processing device is further to provide an indication of whether the detected multi-level RF pulse waveform corresponds to the target multi-level RF pulse waveform to a client device connected to the manufacturing system.

BRIEF DESCRIPTION OF THE DRAWINGS

The present disclosure is illustrated by way of example, and not by way of limitation in the figures of the accompanying drawings. It should be noted that different references to "an" or "one" embodiment in this disclosure are not necessarily to the same embodiment, and such references mean at least one.

DETAILED DESCRIPTION

Figure 1:
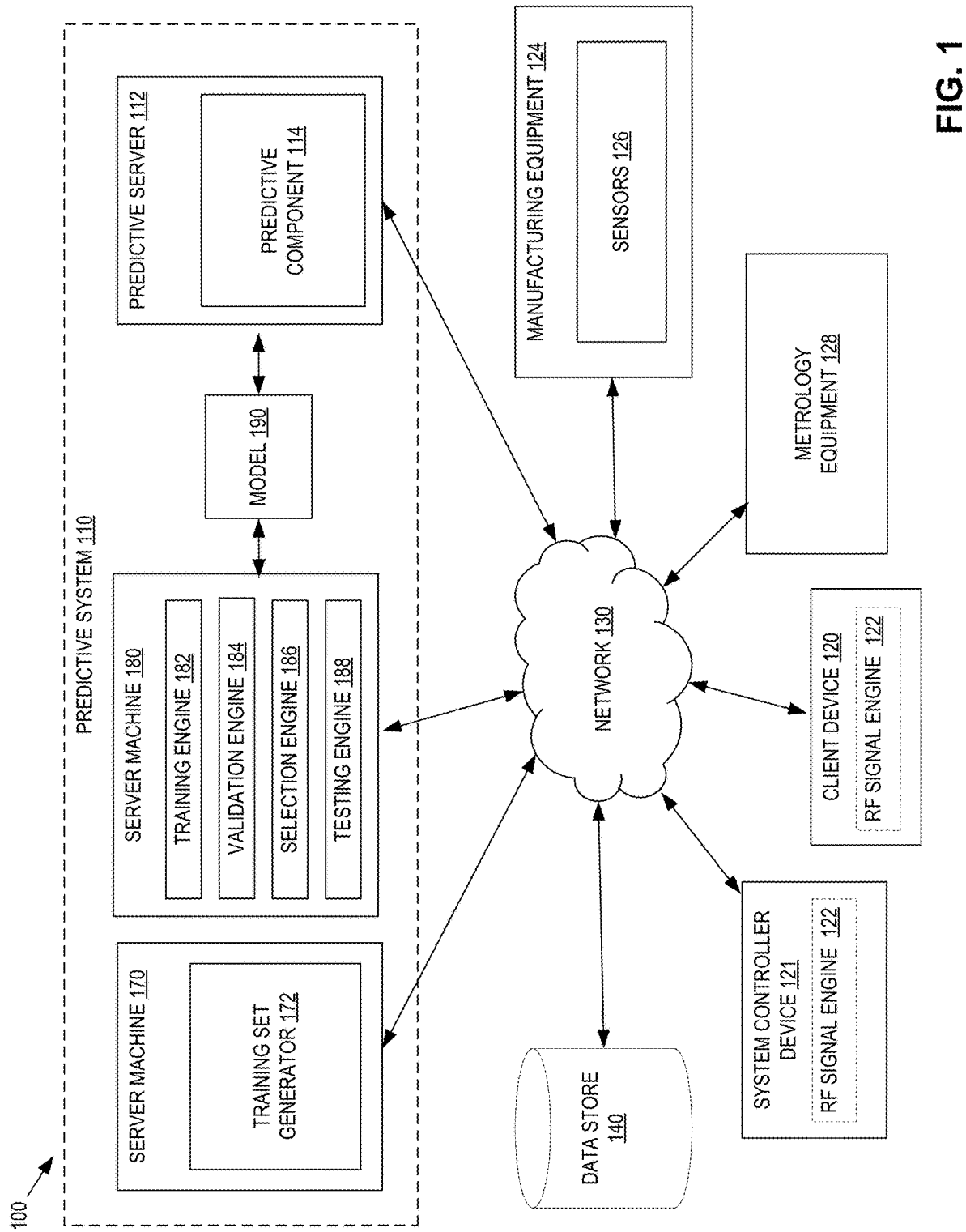
FIG. 1 is a block diagram illustrating an exemplary system architecture, according to aspects of the present disclosure.

Embodiments disclosed herein include methods and systems for multi-level RF pulse monitoring and RF pulsing parameter optimization at a manufacturing system. A manufacturing system can include manufacturing equipment that is configured to perform processes for substrates (referred to as substrate processes herein). A substrate can include a wafer, a semiconductor, a display, and so forth. A substrate process can include a deposition process (e.g., a chemical vapor deposition (CVD) process, an atomic layer deposition (ALD) process, a physical vapor deposition (PVD) process, etc.) to deposit a thin film on a surface of a substrate. In other or similar embodiments, a substrate process can include an etch process to etch away portions of a material deposited on the surface of a substrate to create a target pattern. Substrate processing equipment of a manufacturing system (e.g., a processing chamber, etc.) can process substrates by performing one or more operations of process recipes associated with a particular substrate process (e.g., a deposition process recipe, an etch process recipe, etc.). A process recipe can include multiple recipe operations, such as transfer operations (e.g., robots transporting substrates to different locations), processing operations (e.g., processing substrates in processing chambers), cleaning operations (e.g., cleaning the processing chamber after a processing operation), and/or the like.

For some substrate processes, a fluid is flowed into a processing chamber in a gas state and radio frequency (RF) energy is applied to the fluid to change the state of the fluid from the gas state to a plasma state (e.g., referred to as striking plasma) for recipe operations. The applied RF energy is referred to herein as an RF signal. As the fluid changes from the gas state to the plasma state, there is a dissociation of molecules of the fluid, which increases the pressure in the processing chamber. In some instances, the RF signal is applied as a series of pulses. In some instances, pulsing an RF signal includes generating an RF signal and oscillating the RF signal at particular frequency. In some instances, the pulsed RF signal emits RF energy at varying levels (e.g., a higher energy level followed by a lower or zero energy level). Sensors (e.g., an optical frequency sensor (OFS)) at or coupled to the processing chamber can detect the pulses of the RF signal as a waveform. A waveform refers to a change of a frequency detected within a processing chamber based on the RF pulsing over time. For example, one or more RF pulse generators can generate RF pulsing waveforms within the processing chamber.

In conventional systems, single-level RF pulses are provided within a processing chamber. Such single-level RF pulses are detectable as single-level pulsing waveforms. A single-level pulsing waveform refers to a waveform that is detectable (e.g., by sensors in a processing chamber) for an RF signal that is oscillated at a single energy level within an RF pulsing period. Single-level pulsing waveforms of conventional methods have a single frequency and a single duty cycle (i.e., a ratio of time that a circuit associated with providing energy for the RF signal is on compared to the time the circuit is off) associated with the RF signal provided in the chamber. The gas or plasma within the processing chamber reacts to the RF signal pulsing and the processing chamber sensors can accordingly detect the single-level pulsing waveform. The detected waveform indicates the reaction of the gas or plasma to the RF signal pulsing.

Conventionally, only single-level pulses with a single duty cycle are used in a process operation due to the ease of measuring and controlling such pulses. The pulses of conventional systems or methods are square pulses, which means that the RF signal oscillates between a baseline frequency (i.e., when the circuit associated with providing energy for the RF signal is off), and a single energy level (e.g., single-level) (i.e., the waveform detected for such pulses indicates the shape of a square). A multi-level pulse (e.g., multi-level) refers to an RF signal that is oscillated between multiple frequency levels within a single RF pulsing period. For example, single-level pulses modify the RF energy in the chamber to a single level for each oscillation, while multi-level pulses can modify the RF energy to multiple different levels for each oscillation.

As indicated above, conventional systems only implement single-level pulsing and do not perform more complicated operations allowed by multi-level pulsing due to the difficulty of monitoring and controlling such multi-level pulsing. The methods and techniques used to monitor and control the single-level pulses cannot be used to monitor and control multi-level pulses. Increasingly complex waveforms can be used to produce products of increasing complexity and smaller scale (e.g., substrates, wafers, semiconductors, etc.), which cannot be produced using single-level RF pulsing. Because conventional methods to monitor and control pulsing waveforms are inadequate to measure multi-level waveforms, the multi-level RF pulsing cannot be implemented in conventional systems to manufacture such increasingly small and complex products.

The methods and systems disclosed herein are directed towards multi-level RF pulse monitoring and pulsing parameter optimization at a manufacturing system. A controller for a manufacturing system (referred to as a system controller herein) can cause one or more RF generators to pulse an RF signal within a processing chamber of the manufacturing system. The RF generators can pulse the RF signal in accordance with a set of RF pulsing parameters. In some embodiments, the RF generators generate a pulsing RF signal waveform based on the RF pulsing parameters, which is detectable within the processing chamber, as described above. The RF pulsing parameters can correspond to and/or include a pulsing duty cycle parameter, a pulsing power parameter, a pulsing frequency parameter, a pulsing amplitude parameter, a pulsing drop parameter, a pulsing bias shift parameter, and/or a pulsing time shift (e.g., delay) parameter. The RF pulsing parameters can correspond to a target multi-level RF pulse waveform that is to be generated within the processing chamber for a recipe operation. In some embodiments, the pulsing parameters are provided by a user of the manufacturing system (e.g., an operator, a technician, etc.) via a client device connected to the manufacturing system. In other or similar embodiments, one or more process recipe operations associated with a substrate process at the processing chamber can specify the pulsing parameters. In some embodiments, the pulsing parameters are specified and provided to the RF generators, which cause the RF generators to generate an RF signal to generate a target response of gas or plasma within the processing chamber corresponding to a target level or target waveform. For example, one or more frequencies of an RF signal can be provided to the RF generators based on a target response of a fluid (e.g., gas or plasma) within the processing chamber during a process operation. Such frequencies can correspond to a target waveform that is to be detected within the chamber.

As indicated above, the RF generators can generate and pulse an RF signal in accordance with the RF pulsing parameters. Each generated RF signal can contribute to a multi-level pulse RF signal waveform that is detectable (e.g., by an optical frequency sensor (OFS), etc.) within the process chamber. In some embodiments, multiple RF generators can each generate an RF pulse signal, which can be different from the RF pulse signals generated by other RF generators. Such RF pulse signals can contribute to the multi-level RF pulse waveform that is detectable (e.g., by an OFS, etc.) within the processing chamber. For example, each RF signal generated by a respective RF generator can excite a fluid within the processing chamber from a gas state to a plasma state (e.g., strike plasma) according to a distinct frequency level and one or more duty cycles associated with a respective RF pulse signal. One or more sensors at or coupled to the chamber (e.g., an OFS) can detect an optical response of the plasma based on the multiple RF signals. The optical response can correspond to a multi-level RF pulse waveform within the chamber.

The system controller can receive sensor data indicating the multi-level RF pulse waveform from the one or more sensors monitoring the processing chamber. The system controller can identify one or more peaks in the multi-level RF pulse waveform based on the received sensor data. Each identified peak in the multi-level RF pulse waveform can correspond to at least one RF signal pulse of the RF signal pulsing within the processing chamber. In some embodiments, the system controller can identify the peaks in the multi-level RF pulse waveform by identifying one or more regions of the detected multi-level RF pulse waveform that are associated with an RF signal spike. In some embodiments, an RF signal spike corresponds to a pulse of the RF signal within the processing chamber between a first state to a second state. In some embodiments, the first state is a heightened energy level and the second state is a lower energy level, or vice versa. As indicated above, each of the identified regions correspond to a respective peak of the detected multi-level RF pulse waveform. In some embodiments, the transition area of the RF signal from the first state to the second state corresponds to a respective peak of the detected multi-level RF pulse. In additional or alternative embodiments, the system controller can use one or more machine learning models to identify regions of the multi-level RF pulse waveform that include the peaks, as described in more detail herein.

Based on the one or more peaks identified in the detected multi-level RF pulse waveform, the system controller can determine whether the detected multi-level RF pulse waveform corresponds to the target multi-level RF pulse waveform. For example, the system controller can determine that the detected multi-level RF pulse waveform corresponds to the target multi-level RF pulse waveform if one or more peaks (e.g., a magnitude of the peaks, a location of the peaks, etc.) identified in the detected multi-level RF pulse waveform sufficiently matches (e.g., approximately matches) corresponding peaks of the target multi-level RF pulse waveform (e.g., within a predetermined threshold). The system controller can transmit an indication of whether the detected multi-level RF pulse waveform corresponds to the target multi-level RF pulse waveform to a client device connected to the manufacturing system. For example, if the system controller determines that the detected waveform matches (or approximately matches) the target multi-level RF pulse waveform (e.g., within a predetermined threshold), the system controller can transmit an indication to the client device connected to the manufacturing system to a user indicating such. The system controller can also transmit, in some embodiments, data associated with the one or more peaks identified in the detected multi-level RF pulse waveform.

In some embodiments, a user of the manufacturing system (e.g., an operator, a technician, etc.) can update (e.g., tune) the RF pulsing parameters based on data associated with the one or more peaks identified in the detected multi-level RF pulse waveform. For example, the user can update the RF pulsing parameters that were provided to generate the detected multi-level RF pulse waveform to increase or decrease a level of RF pulsing for a future substrate process performed at the processing chamber. The RF signals generated based on the updated RF pulsing parameters can contribute to an updated multi-level RF pulse waveform (i.e., detected in the processing chamber as described above). The system controller can determine, in one illustrative example, that the updated multi-level RF pulse waveform more closely corresponds to the target multi-level RF pulse waveform, in accordance with previously described embodiments. Accordingly, the user can tune the RF pulsing parameters for a substrate process such to optimize a manufacturing process recipe. Optimizing the process recipe can lead to a substrate being processed in accordance with a target state.

Implementations of the present disclosure address the above-described deficiencies of the current technology by providing techniques for monitoring multi-level RF pulse waveforms and enabling a user (e.g., an operator, a technician, etc.) to optimize RF pulsing parameters of a manufacturing system. Embodiments of the present disclosure provide techniques to accurately measure complex RF waveforms detected within the processing chamber, including multi-level RF pulse waveforms. More accurate measurement of such waveforms allow for the use of increasingly complicated waveforms (e.g., multi-level RF pulse waveforms) as part of a process operation, which in turn allow for the manufacture of increasingly small-scale and complex products. Additionally, embodiments of the present disclosure allow a user (e.g., an operator, a technician) to optimize and/or adjust RF pulsing parameters provided to one or more RF generators to generate a multi-level RF signal. Accordingly, the user can optimize and/or adjust the RF signal to cause the response of fluid (e.g., gas or plasma) within the processing chamber more closely matches a target response, leading to more precise and more accurate manufacturing of products. Accordingly, embodiments of the present disclosure can enable manufacturing of products (e.g., wafers, substrates, semiconductors, etc.) with increased accuracy, precision, consistency, and/or quality. Manufacturing products with increased accuracy, precision, and/or quality can lead to a higher efficiency and throughput and a decrease in an overall latency of the manufacturing system. Accordingly, the system controller consumes fewer computing resources (e.g., processing cycles, memory space, etc.) for performing substrate processes at the manufacturing system, which improves overall efficiency and decreases overall latency of the computing system associated with the manufacturing system.

FIG. 1 is a block diagram illustrating an exemplary system architecture, according to aspects of the present disclosure. In some embodiments, computer system architecture 100 may be included as part of a manufacturing system for processing substrates. Computer system architecture 100 includes a client device 120, a system controller device 121 (e.g., controller, server), manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 126 configured to capture data for a substrate being processed by the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 produces products following a recipe or performing runs over a period of time. Manufacturing equipment 124 can include one or more sensors 126 configured to generate data for a substrate during a substrate process (referred to as sensor data). Sensor data may include a value of one or more of temperature (e.g., heater temperature), spacing (SP), pressure, high frequency radio frequency (HFRF), voltage of electrostatic chuck (ESC), electrical current, flow, power, voltage, optical frequency data, waveform data (e.g., multi-level RF pulse waveform data), etc. Sensor data may be associated with or indicative of manufacturing parameters such as hardware parameters, such as settings or components (e.g., size, type, etc.) of the manufacturing equipment 124, or process parameters of the manufacturing equipment 124. Sensor data may be indicative of a waveform (e.g., multi-level RF pulse waveform) within a processing chamber of the manufacturing equipment 124. In some embodiments, the sensor data can be provided while the manufacturing equipment 124 is performing manufacturing processes (e.g., equipment readings when processing products), or after the manufacturing equipment 124 has completed a manufacturing process, in additional or alternative embodiments.

Metrology equipment 128 provides metrology data associated with substrates (e.g., wafers, etc.) processed by manufacturing equipment 124. In some embodiments, metrology equipment 128 can be included or connected to one or more components of manufacturing equipment 124. Accordingly, metrology equipment 128 can generate metrology data associated with a substrate without the substrate being removed from a vacuum environment of manufacturing equipment 124, in some embodiments. In other or similar embodiments, metrology equipment 128 can be external equipment to manufacturing equipment 124. In such embodiments, the substrate can be measured at metrology equipment 128 before the substrate is introduced to the vacuum environment and/or after the substrate is removed from the vacuum environment of manufacturing equipment 124. The metrology data generated by metrology equipment 128 can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. In some embodiments, the metrology equipment 128 can generate metrology data for a substrate before and/or after processing. In some embodiments, the metrology data can be used to generate training data for training one or more machine learning models and/or for detecting locations of one or more peaks associated with a multi-level RF pulse waveform detected within a processing chamber.

The client device 120 includes a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data may be received from the client device 120. In some embodiments, client device 120 displays a graphical user interface (GUI), where the GUI enables the user to provide, as input, metrology measurement values for substrates processed at the manufacturing system. In other or similar embodiments, client device 120 can display another GUI that enables user to provide, as input, an indication of a type of substrate to be processed at the manufacturing system, a type of process to be performed for the substrate, and/or a type of equipment at the manufacturing system. The client device includes one or more processing engines. For example, client device 120 can include RF signal engine 122 described in FIG. 3.

The system controller device 121 (e.g., controller, server) includes one or more computing devices such as a rack-mount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc. In some embodiments, the system controller device 121 includes an RF signal engine 122 described in FIG. 3. In some embodiments, system controller device 121 is a controller of a semiconductor processing system and is used to control the manufacturing equipment 124.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that may span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a previous substrate processed at the manufacturing system) and/or current process data (e.g., process data generated for a current substrate processed at the manufacturing system). Current process data can be data for which predictive data is generated. In some embodiments, data store can store metrology data including historical metrology data (e.g., metrology measurement values for a prior substrate processed at the manufacturing system).

In some embodiments, data store 140 can store data associated with a multi-level RF pulse waveform. For example, data store 140 can store RF pulse data, RF signal spike data, RF pulsing parameter data, and RF signal peak data including RF signal peak location data. In some embodiments, data store 140 can store historical data associated with historical multi-level RF pulse waveforms. For example, data store 140 can store historical sensor data, historical RF pulse data, historical RF signal spike data, historical RF pulsing parameter data, and historical RF signal peak data including historical RF signal peak location data.

The data store 140 can also store contextual data associated with one or more substrates processed at the manufacturing system. Contextual data can include a recipe name, recipe operation number, preventive maintenance indicator, operator, etc.

In some embodiments, data store 140 can be configured to store data that is not accessible to a user of the manufacturing system. For example, process data, spectral data, non-spectral data, and/or positional data obtained for a substrate being processed at the manufacturing system may not be accessible to a user of the manufacturing system. In some embodiments, all data stored at data store 140 is inaccessible by a user (e.g., an operator) of the manufacturing system. In other or similar embodiments, a portion of data stored at data store 140 is inaccessible by the user while another portion of data stored at data store 140 is accessible by the user. In some embodiments, one or more portions of data stored at data store 140 are encrypted using an encryption mechanism that is unknown to the user (e.g., data is encrypted using a private encryption key). In other or similar embodiments, data store 140 includes multiple data stores where data that is inaccessible to the user is stored in one or more first data stores and data that is accessible to the user is stored in one or more second data stores.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. Some operations of training set generator 172 are described in detail below with respect to FIG. 5A. In some embodiments, the training set generator 172 can partition the training data into a training set, a validating set, and a testing set. In some embodiments, the predictive system 110 generates multiple sets of training data.

Server machine 180 includes a training engine 182, a validation engine 184, a selection engine 186, and/or a testing engine 188. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. In some embodiments, the machine learning model 190 uses one or more of support vector machine (SVM), Radial Basis Function (RBF), clustering, supervised machine learning, semi-supervised machine learning, unsupervised machine learning, k-nearest neighbor algorithm (k-NN), linear regression, supervised regression, random forest, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 186 can be capable of selecting a trained machine learning model 190 that has an accuracy that meets a threshold accuracy. In some embodiments, the selection engine 186 can be capable of selecting the trained machine learning model 190 that has the highest accuracy of the trained machine learning models 190.

The testing engine 188 can be capable of testing a trained machine learning model 190 using a corresponding set of features of a testing set from training set generator 172. For example, a first trained machine learning model 190 that was trained using a first set of features of the training set can be tested using the first set of features of the testing set. The testing engine 188 can determine a trained machine learning model 190 that has the highest accuracy of all of the trained machine learning models based on the testing sets.

Predictive server 112 includes a predictive component 114 that is capable of providing data collected by one or more sensors at a manufacturing system during a current process performed for a first set of substrates as input to trained machine learning model 190 and running trained machine learning model 190 on the input to obtain one or more outputs. In some embodiments, predictive component 114 is also capable of extracting RF signal spike region data from one or more obtained outputs of the trained machine learning model and using the RF signal spike region data to determine one or more regions of the detected multi-level RF pulse waveform that are associated with an RF signal spike.

The RF signal spike region data can include an indication of one or more areas of the data associated with the multi-level RF pulse waveform in the processing chamber corresponding to one or more RF signal spikes. In some embodiments, the RF signal spike region data includes an indication of one or more locations of one or more peaks in the detected multi-level RF pulse waveform. For example, the RF signal spike region data can identify a region of sensor data associated with the multi-level RF pulse waveform where a peak in the RF signal occurs (e.g., corresponding to one or more RF signal spikes).

The client device 120, system controller device 121, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, may be provided by a fewer number of machines. For example, in some embodiments, server machines 170 and 180 may be integrated into a single machine, while in some other or similar embodiments, server machines 170 and 180, as well as predictive server 112, may be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual (e.g., an operator, a technician, an engineer, etc.). However, other embodiments of the disclosure encompass a "user" being an entity controlled by a plurality of users and/or an automated source. For example, a set of individual users federated as a group of administrators may be considered a "user."

Although some embodiments of the present disclosure describe measuring optical waveforms and multi-level RF pulse waveforms in a substrate processing system, the present disclosure, in some embodiments, is applied to other systems, such as manufacturing systems, etc. that perform operations over time.

Figure 2:
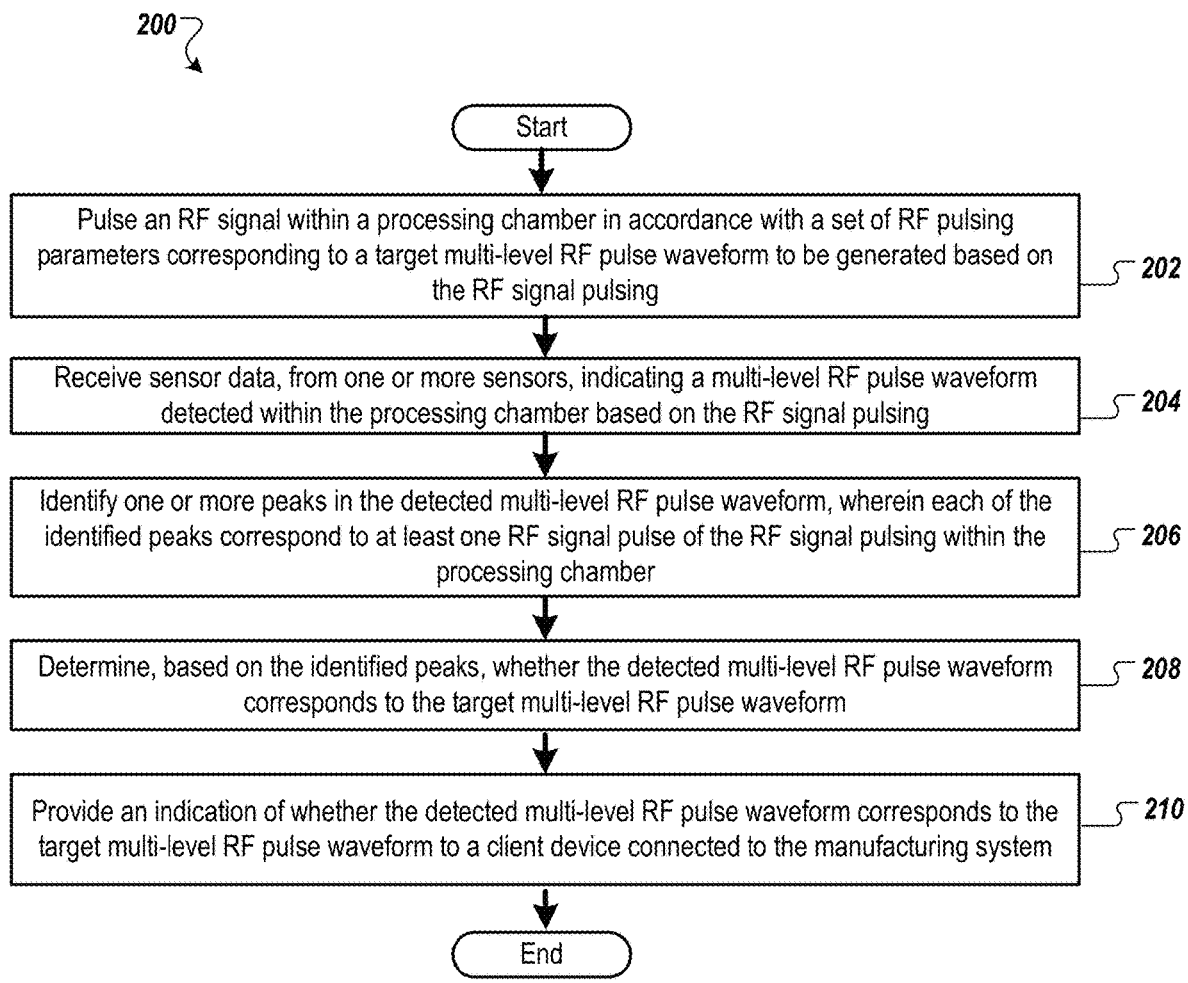
FIG. 2 is a flow diagram of a method for RF pulse monitoring, according to aspects of the present disclosure.

FIG. 2 is a flow diagram of a method for RF pulse monitoring, according to aspects of the present disclosure. Method 200 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 200 is performed, in part, by RF signal engine 122 (e.g., residing at system controller device 121 and/or client device 120, as described with respect to FIG. 1). In other or similar embodiments, method 200 is performed, in part, by a predictive system (e.g., predictive system 110). In some embodiments, a non-transitory storage medium stores instructions that when executed by a processing device (e.g., predictive system 110, RF signal engine 122, etc.) cause the processing device to perform method 200. In some embodiments, the storage medium is a non-transitory machine-readable storage medium storing instructions that when executed by a processing device (e.g., predictive system 110, RF signal engine 122, etc.) cause the processing device to perform method 200.

For simplicity of explanation, method 200 is depicted and described as a series of operations. However, operations in accordance with this disclosure can occur in various orders and/or concurrently and with other operations not presented and described herein. Furthermore, in some embodiments, not all illustrated operations are be performed to implement method 200 in accordance with the disclosed subject matter. In addition, those skilled in the art will understand and appreciate that method 200 could alternatively be represented as a series of interrelated states via a state diagram or events.

Referring to FIG. 2, a flow diagram of a method 200 (e.g., process sequence for measuring waveforms and multi-level pulsing within a processing chamber) for substrate processing equipment (e.g., a processing chamber, manufacturing equipment 124 of FIG. 1), according to aspects of the present disclosure is shown.

At block 202 of method 200, processing logic pulses an RF signal within a processing chamber in accordance with a set of RF pulsing parameters. The RF pulsing parameters correspond to a target multi-level RF pulse waveform to be generated within the processing chamber based on the RF signal pulsing. For example, the target multi-level RF pulse waveform corresponds to a target waveform of a process recipe, and the set of RF pulsing parameters are specified to correspond to the target multi-level RF pulse waveform. As another example, a user can specify the RF pulsing parameters based on a target response (e.g., target behavior, target multi-level RF pulse waveform) to be generated in fluid of the processing chamber. In such an example, the RF pulsing parameters does not correspond directly to the target response, but instead can correlate to an RF signal that will induce the target response.

In some embodiments, the set of RF pulsing parameters are provided, by the processing device, as input to one or more RF signal generators associated with the processing chamber. In some embodiments, the RF pulsing parameters can be provided to multiple RF signal generators connected to the processing chamber. In some embodiments, a set of RF signal generators is associated with the processing chamber. In some embodiments, the set of RF signal generators includes three RF signal generators. Each RF signal generator can be configured to output an RF signal based on a received set of RF pulsing parameters. Each RF signal generator can also be configured to pulse or oscillate a generated RF signal based on the received set of RF pulsing parameters. In some embodiments, the RF signal pulsing provided by the RF signal generators corresponds to a multi-level RF pulse waveform that is detectable within the processing chamber. The multi-level RF pulse waveform can correspond to the RF pulsing parameters.

At block 204, the processing device receives sensor data from one or more sensors associated with the processing chamber. In some embodiments, the one or more sensors include at least an optical frequency sensor (OFS). In some embodiments, the optical frequency sensor senses an optical response of plasma within the processing chamber to the RF signal output by the set of RF signal generators. The sensor data received from the one or more sensors is indicative of a multi-level RF pulse waveform detected within the processing chamber based on the RF signal pulsing. In some embodiments, the multi-level RF pulse waveform detected within the processing chamber corresponds to the RF signal pulsing provided by the set of RF signal generators.

At block 206, processing logic identifies one or more peaks in the detected multi-level RF pulse waveform. In some embodiments, the peaks in the detected multi-level RF pulse waveform correspond to regions of the detected multi-level RF pulse waveform associated with an RF signal spike. In some embodiments, the RF signal spike corresponds to a transition of the RF signal within the processing chamber from a first state to a second state (i.e., from high energy to low energy, etc.). In some embodiments, the RF signal spike corresponds to a transition in the optical response of the plasma within the processing chamber to the RF signal output by the set of RF signal generators.

In some embodiments, the one or more peaks in the detected multi-level RF pulse waveform are identified by the processing logic applying one or more data transform operations to the sensor data to obtain a transformed multi-level RF pulse waveform. In some embodiments, the data transform operation is to amplify an intensity of one or more RF signal spikes associated with the detected multi-level RF pulse waveform. In some embodiments, one or more regions associated with the RF signal spike are identified by the processing logic based on the transformed multi-level RF pulse waveform. For example, a data transform operation can magnify data of interest in the sensor data (e.g., of the multi-level RF pulse waveform), from which regions associated with the RF signal spike can be identified.

At block 208, processing logic determines, based on the identified one or more peaks, whether the detected multi-level RF pulse waveform corresponds to the target multi-level RF pulse waveform. For example, the processing logic verifies that the plasma response to the RF signal output by the set of RF signal generators corresponds to the target multi-level RF pulse waveform. In some embodiments, determining whether the detected multi-level RF pulse waveform corresponds to the target multi-level RF pulse waveform includes determining whether at least one of a location or a magnitude of a respective identified region of the detected multi-level RF pulse waveform corresponds to at least one of a target location or a target magnitude of a target signal spike region of the target multi-level RF pulse waveform. For example, the processing logic can determine that the location of one or more peaks of the multi-level RF pulse waveform corresponds to a target location of a target signal spike of the target multi-level RF pulse waveform. Alternatively, the processing logic can determine that the magnitude of one or more peaks of the multi-level RF pulse waveform corresponds to a target magnitude of a target signal spike of the target multi-level RF pulse waveform.

Additionally, in some embodiments, determining whether the detected multi-level RF pulse waveform corresponds to the target multi-level RF pulse waveform further includes, determining that the detected multi-level RF pulse waveform corresponds to the target multi-level RF pulse waveform. In some embodiments, the determining is done responsive to determining that that at least one of the location or the magnitude of the respective identified regions corresponds to the at least one of the target location or the target magnitude of the target spike region. For example, should a location of an identified region of the detected multi-level RF pulse waveform associated with an RF signal spike correspond to a target location of the target signal spike region, the processing logic determines that the detected multi-level RF pulse waveform corresponds to the target multi-level RF pulse waveform.

At block 210, the processing device provides an indication of whether the detected multi-level RF pulse waveform corresponds to the target multi-level RF pulse waveform. In some embodiments, the indication is provided via a GUI of a client device (e.g., client device 120 of FIG. 1) connected to the manufacturing system. In some embodiments, the indication includes providing a location of each of the one or more peaks in the detected multi-level RF pulse waveform. In some embodiments, the location of each of the peaks corresponds to a location of a region associated with an RF signal spike. For example, the processing device may provide to the GUI data indicating locations of the one or more peaks, the GUI to display the data to a user. In some embodiments, the GUI displays the locations of the one or more peaks.

Figure 3:
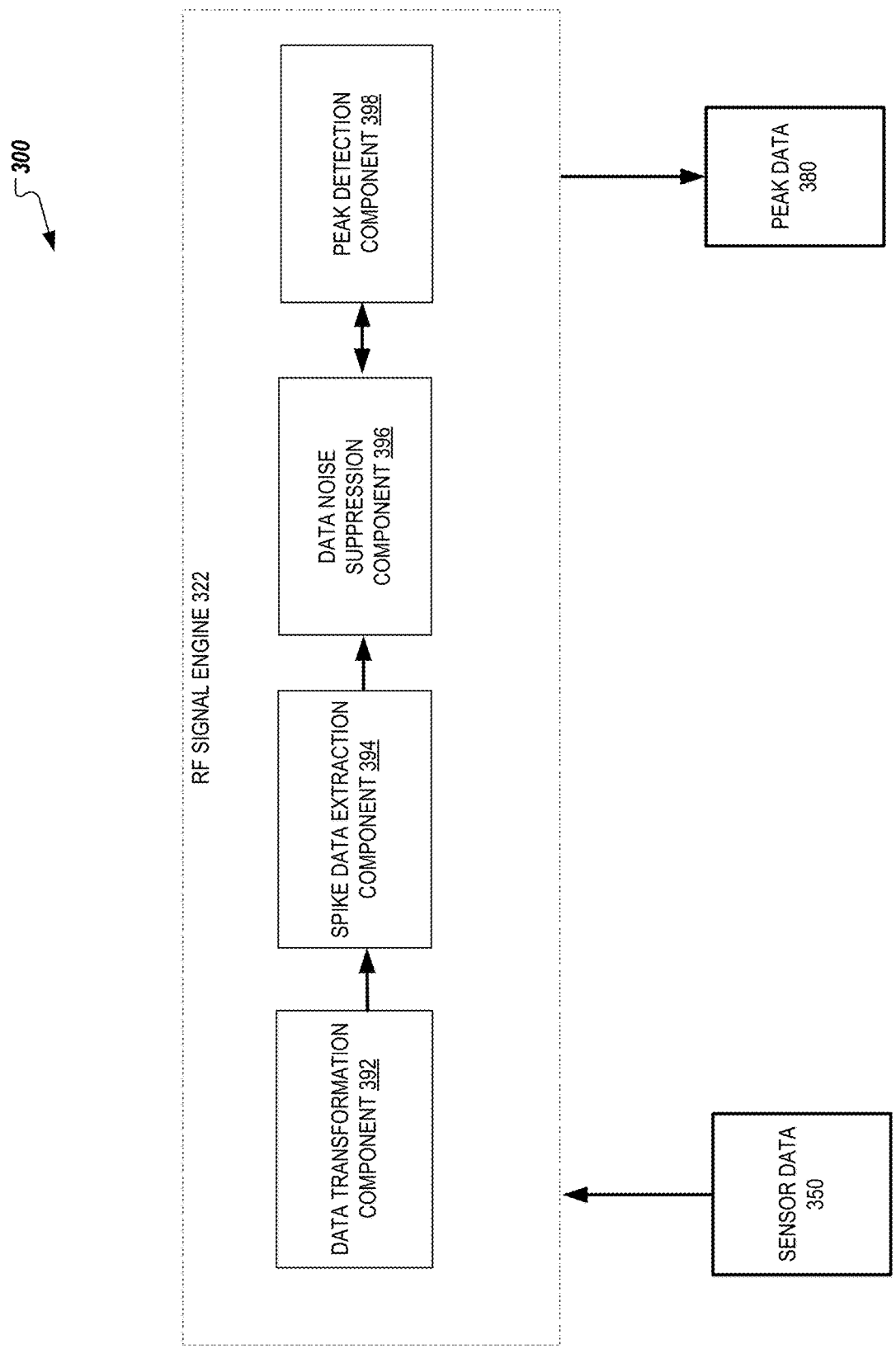
FIG. 3 is a block diagram illustrating an example radio frequency (RF) signal engine associated with measuring waveforms and multi-level pulsing within a processing chamber, according to aspects of the present disclosure.

FIG. 3 is a block diagram illustrating an example radio frequency (RF) signal engine associated with measuring waveforms and multi-level pulsing within a processing chamber, according to aspects of the present disclosure. In some embodiments, the RF signal engine 322 corresponds to RF signal engine 122 of FIG. 1. In some embodiments, RF signal engine 322 includes one or more components. For example, RF signal engine 322 can include data transformation component 392, spike data extraction component 394, data noise suppression component 196, and/or peak detection component 398. In some embodiments, each component of RF signal engine 322 performs one or more operations.

In some embodiments, RF signal engine 322 receives sensor data 350. The sensor data is received from one or more sensors associated with a processing chamber. In some embodiments, the sensor data is indicative of a multi-level RF pulse waveform detected within the processing chamber. As described above, the multi-level RF pulse waveform detected within the processing chamber corresponds to an optical response of plasma within the processing chamber to an RF signal output by one or more RF signal generators.

In some embodiments, the data transformation component 392 receives the sensor data 350 from the one or more sensors at manufacturing equipment 124. In other or similar embodiments, data transformation component 392 can obtain the sensor data 350 (e.g., from data store 140). In some embodiments, the data transformation component 392 applies one or more data transform operations to the sensor data to obtain transformed multi-level RF pulse waveform data. In some embodiments, the one or more data transform operations include a base-ten logarithm transform operation, a natural logarithm transform operation, an inverse transform operation, an inverse logarithm transform operation, or no transform operation. The data transform operation can amplify an intensity of one or more RF signal spikes associated with the detected multi-level RF pulse waveform. In some embodiments, a machine learning model can be used to identify a data transformation operation to use from a set of data transformation operations. Sensor data can be provided as input to a machine learning model. The machine learning can be trained to identify a data transformation to be applied to given sensor data based on historical sensor data and historical data transformation operations applied to the historical sensor data. Data transformation component 392 can identify a data transformation operation to apply to the sensor data based on one or more outputs of the machine learning model and can apply the identified data transformation operation to the sensor data, as described above. In some embodiments, an optimization model is used to identify a data transformation to use from a set of data transformation operations.

In some embodiments, data transformation component 392 provides the transformed multi-level RF pulse waveform data to spike data extraction component 394. In some embodiments, spike data extraction component 394 determines spike data associated with the transformed multi-level RF pulse waveform data (see e.g., spike signal of FIG. 4). In some embodiments, the spike data is based on the transformed multi-level RF pulse waveform data. In some embodiments, spike data extraction component 394 determines transitions in the transformed multi-level RF pulse waveform data. The spike data can correspond to transitions in the transformed multi-level RF pulse waveform data. In some embodiments, spike data extraction component 394 determines a magnitude of a rate of change of one or more regions of the transformed multi-level RF pulse waveform data. For example, spike data extraction component 394 may identify magnitudes of rates of change of the transformed multi-level RF pulse waveform data. In some embodiments, the magnitude of some regions of the transformed multi-level RF pulse waveform data can have a larger rate of change with a magnitude larger other regions. The spike data can indicate one or more maxima or minima (e.g., a spike) corresponding with the one or more regions of the transformed multi-level RF pulse waveform data having a rate of change with a magnitude larger than one or more other regions (see e.g., peaks of FIG. 4). In some embodiments, spike data extraction component 394 employs one or more operators to determine the spike data from the transformed multi-level RF pulse waveform data. For example, spike data extraction component 394 can employ a Teager-Kaiser Energy Operator to determine the spike data from the transformed multi-level RF pulse waveform data.

In some embodiments, spike data extraction component 394 provides the spike data to data noise suppression component 396. Data noise suppression component 396 can be configured to reduce (e.g., attenuate) noise in the spike data. Noise can refer to additional or extra data that distracts from portions of the data which are of interest. By reducing of the amount of noise in the data, RF signal engine 322 can better isolate peaks in the spike data, the peaks corresponding to regions of the detected multi-level RF pulse waveform that are associated with an RF signal spike. In some embodiments, data noise suppression component 396 can perform one or more data averaging operations for the spike data. In some embodiments, a data averaging operation performed by the data noise suppression component 396 can correspond to a first-in-first-out (FIFO) matrix operation. In other or similar embodiments, data noise suppression component 396 uses a moving-average filter to reduce noise in the spike data.

In some embodiments, data noise suppression component 396 provides the spike data with reduced noise to peak detection component 398. In some embodiments, peak detection component 398 identifies a number of peaks in the spike data. In some embodiments, peak detection component 398 can use a local maxima approach to identify peaks in the spike data. For example, peak detection component 398 can identify a local maxima in a region associated with the spike data that is separated (e.g., based on a threshold distance) from another region associated with the spike data that corresponds to another local maxima. The local maxima of each region can correspond to a respective peak of the waveform. For example, peak detection component 398 can determine that two local maxima located within a threshold distance from one another correspond to a single peak. In another example, peak detection component 398 can determine that two local maxima located outside of the threshold distance from one another correspond to at least two distinct peaks. In some embodiments, peak detection component 398 determines a location and a magnitude of each identified peak. In some embodiments, each detected peak can correspond to a peak specified (e.g., by a user) to be detected within the spike data. In such embodiments, processing logic determines a number of peaks for the peak detection component 398 to detect within the spike data based on the specified number of peaks.

In some embodiments, peak detection component 398 produces peak data 380. In some embodiments, peak data 380 can include an indication of one or more peak locations and/or peak magnitudes associated with each peak identified for the multi-level RF pulse waveform. In some embodiments, peak detection component provides peak data 380 to data noise suppression component 396. Data noise suppression component 396 performs one or more data averaging operations on peak data 380 to reduce (e.g., attenuate) noise in the peak data 380. In some embodiments, after noise in peak data 380 is reduced, peak data 380 can indicate one or more average locations and/or one or more average magnitudes of one or more corresponding peaks of a spike signal (e.g., spike signal of FIG. 4) associated with the multi-level RF pulse waveform.

In some embodiments, one or more of the functions of the RF signal engine 322 are performed by one or more machine learning models. In some embodiments, a trained machine learning model determines peak data 380 based on receiving sensor data 350 as input. Machine learning implementations of this disclosure are discussed in more detail in connection with FIGS. 5A-C.

Figure 4:
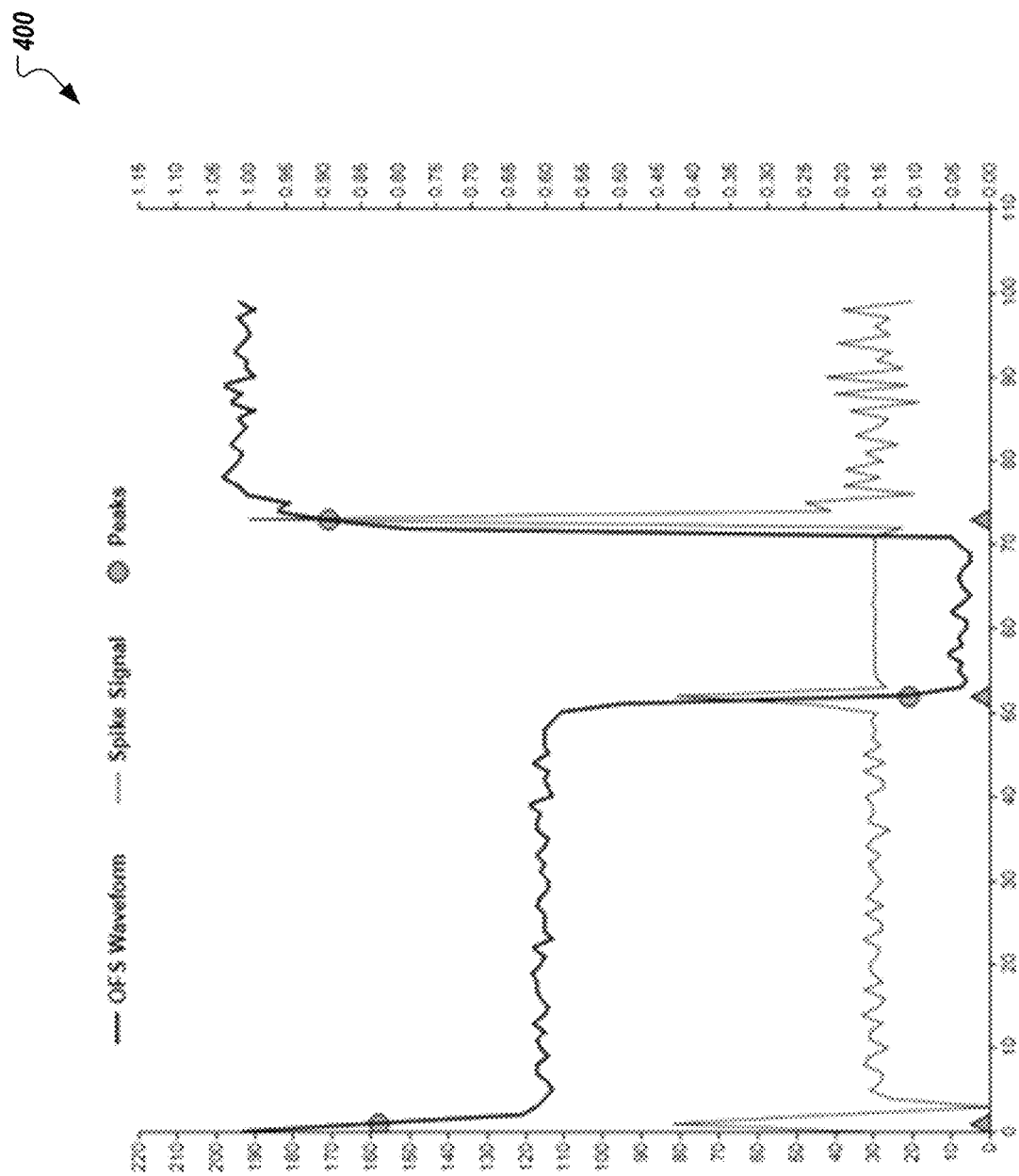
FIG. 4 is a graph illustrating a multi-level RF pulse waveform, associated spike signal, and associated peaks, according to aspects of the present disclosure.

FIG. 4 is a graph illustrating a multi-level RF pulse waveform, associated spike signal, and associated peaks, according to aspects of the present disclosure. In some embodiments, sensor data (e.g., sensor data 350 of FIG. 3) includes an optical frequency sensor (OFS) waveform. In some embodiments, the OFS waveform is a multi-level RF pulse waveform detected in a processing chamber. In some embodiments, the OFS waveform indicates a response to one or more RF signals generated by one or more RF generators associated with the processing chamber according to a set of RF pulsing parameters. In some embodiments, the OFS waveform is an optical response of plasma within the processing chamber to the one or more signals generated by the one or more RF generators.

In some embodiments, a spike signal is identified (e.g., by spike data extraction component 394 of FIG. 3) based on the OFS waveform. In some embodiments, the spike signal corresponds to spike data (i.e., generated by spike data extraction component 394). In some embodiments, data noise in either or both of the OFS waveform and/or the spike signal are reduced (e.g., attenuated) by a data noise attenuation component (e.g., data noise suppression component 396 of FIG. 3). In some embodiments, the spike signal contains one or more local maxima or minima. In some embodiments, the local maxima of the spike signal correspond to one or more regions of the OFS waveform with a high rate of change.

In some embodiments, one or more peaks of the OFS waveform correspond to one or more local maxima of the spike signal. In some embodiments, the one or more peaks are identified by a peak detection component (e.g., peak detection component 398 of FIG. 3). In some embodiments, the one or more peaks are associated with a spike in the spike signal (e.g., RF signal spike). In some embodiments, the location of each of the one or more peaks (see triangles on the x-axis of FIG. 4) is provided to a client device (e.g., via network 130). In some embodiments, the locations of each peak are provided to a user via a GUI of a client device. In some embodiments, the location of each of the one or more peaks is an average location of each of the one or more peaks based on multiple samples of the OFS waveform. In some embodiments, a corrective action is performed based on the location of each of the one or more peaks.

Figure 5A:
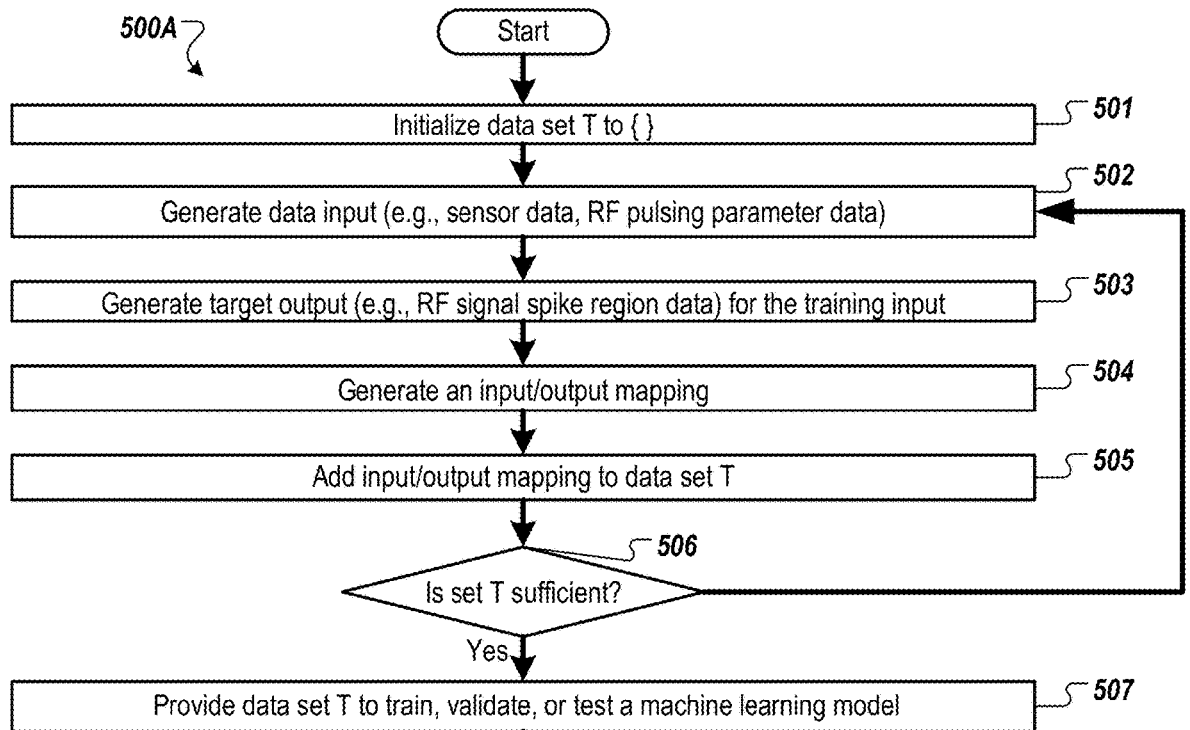
FIGS. 5A-C are flow diagrams of methods for training and using a machine learning model to detect RF peaks in a detected multi-level RF pulse waveform, according to aspects of the present disclosure.
Figure 5B:
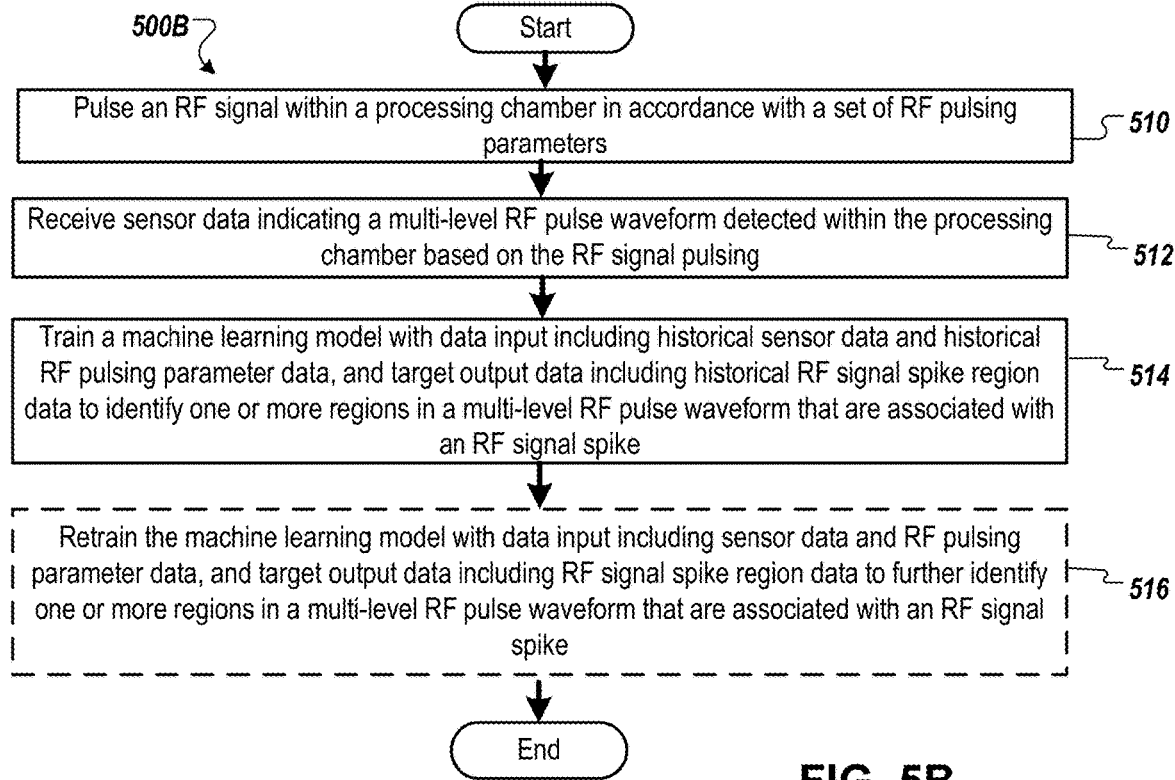
Figure 5C:
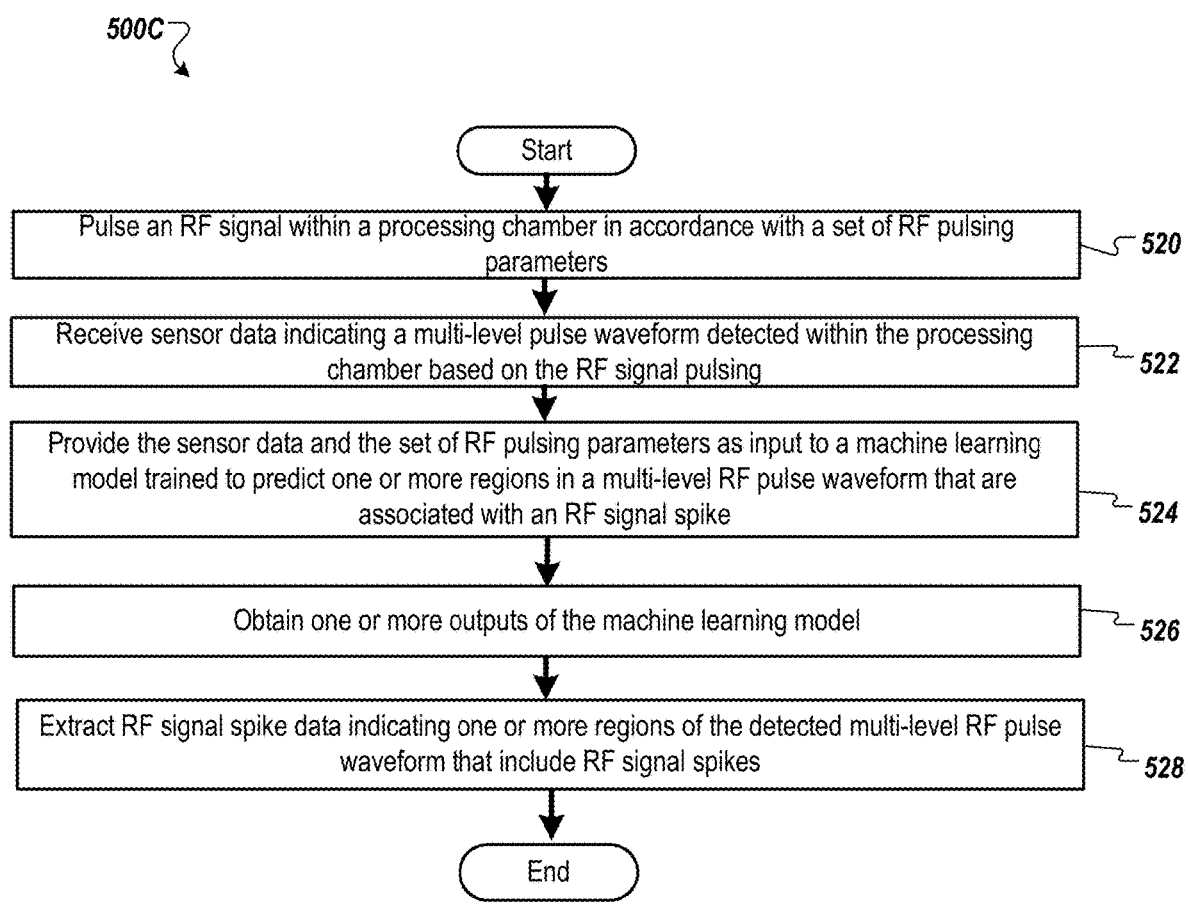

FIGS. 5A-C are flow diagrams of methods 500A-C for training and using a machine learning model to detect RF peaks in a detected multi-level RF waveform, according to aspects of the present disclosure. Methods 500A-C can be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 500A-C may be performed, in part, by predictive system 110. Method 500A can be performed, in part, by predictive system 110 (e.g., server machine 170 and training set generator 172 of FIG. 1). Predictive system 110 may use method 500A to generate a data set to at least one of train, validate, or test a machine learning model, in accordance with embodiments of the disclosure. Method 500B may be performed by server machine 180 (e.g., training engine 182, etc.). Method 500C may be performed by predictive server 112 (e.g., predictive component 114). In some embodiments, a non-transitory storage medium stores instructions that when executed by a processing device (e.g., of predictive system 110, of server machine 180, of predictive server 112, etc.) cause the processing device to perform one or more of methods 500A-C. In some embodiments, the storage medium is a non-transitory machine-readable storage medium storing instructions that when executed by a processing device (e.g., predictive system 110, client device 120, etc.) cause the processing device to perform methods 500A-C.

For simplicity of explanation, methods 500A-C are depicted and described as a series of operations. However, operations in accordance with this disclosure can occur in various orders and/or concurrently and with other operations not presented and described herein. Furthermore, not all illustrated operations may be performed to implement methods 500A-C in accordance with the disclosed subject matter. In addition, those skilled in the art will understand and appreciate that methods 500A-C could alternatively be represented as a series of interrelated states via a state diagram or events.

FIG. 5A is a flow diagram of a method 500A for generating a data set for training a machine learning model (e.g., model 190 of FIG. 1) to detect RF peaks (e.g., peak data 380 of FIG. 3) in a detected multi-level RF pulse waveform, according to aspects of the present disclosure.

Referring to FIG. 5A, in some embodiments, at block 501 the processing logic implementing method 500A initializes a training set T to an empty set.

At block 502, processing logic generates first data input (e.g., first training input, first validating input) that may include sensor data (e.g., sensor data 350 of FIG. 3), etc. In some embodiments, the first data input may include a first set of features for types of data and a second data input may include a second set of features for types of data.

At block 503, processing logic generates a first target output for one or more of the data inputs (e.g., first data input). In some embodiments, the first target output is property values received as the output from RF signal engine 322 (e.g., peak data 380).

At block 504, processing logic optionally generates mapping data that is indicative of an input/output mapping. The input/output mapping (or mapping data) may refer to the data input (e.g., one or more of the data inputs described herein), the target output for the data input, and an association between the data input(s) and the target output.

At block 505, processing logic adds the mapping data generated at block 504 to data set T, in some embodiments.

At block 506, processing logic branches based on whether data set T is sufficient for at least one of training, validating, and/or testing machine learning model 190 of FIG. 1. If so, execution proceeds to block 507, otherwise, execution returns to block 502. It should be noted that in some embodiments, the sufficiency of data set T may be determined based simply on the number of inputs, mapped in some embodiments to outputs, in the data set, while in some other implementations, the sufficiency of data set T may be determined based on one or more other criteria (e.g., a measure of diversity of the data examples, accuracy, etc.) in addition to, or instead of, the number of inputs.

At block 507, processing logic provides data set T (e.g., to server machine 180 of FIG. 1) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 188 of server machine 180 to perform the testing.

Over many training sets, the machine learning model chooses an appropriate value of a parameter controlling the number of non-zero coefficients in the reduced order model. After block 507, machine learning model (e.g., machine learning model 190) can be at least one of trained using training engine 182 of server machine 180, validated using validating engine 184 of server machine 180, or tested using testing engine 188 of server machine 180. The trained machine learning model may be implemented by predictive component 114 (of predictive server 112) to generate peak data 380 for performing signal processing or for performing corrective action associated with the manufacturing equipment 124.

FIG. 5B is a method 500B for training a machine learning model (e.g., model 190 of FIG. 1) to detect RF peaks in a detected multi-level RF pulse waveform, according to aspects of the present disclosure.

Referring to FIG. 5B, at block 510 of method 500B, the processing logic pulses an RF signal within a processing chamber in accordance with a set of RF pulsing parameters. In some embodiments, the processing logic causes the pulsing of an RF signal by one or more RF signal generators based on the set of RF pulsing parameters. In some embodiments, the RF signal generators cause a response in the processing chamber in the form of a multi-level RF pulse waveform in fluid of the processing chamber, as described above.

At block 512, processing logic receives sensor data from one or more sensors associated with the processing chamber. The sensor data indicates a multi-level RF pulse waveform detected within the processing chamber based on the RF signal pulsing by the RF generators. In some embodiments, the sensor data indicates an optical response of plasma within the processing chamber to the RF signal pulsing. The sensor data can be retrieved by the processing logic from memory (e.g., data store 140 of FIG. 1), rather than directly from the one or more sensors.

At block 514, the processing logic trains a machine learning model (e.g., model 190 of FIG. 1). The machine learning model is trained with data input including historical sensor data and historical RF pulsing parameter data. In some embodiments, historical sensor data corresponds to the sensor data, and historical sensor RF pulsing parameter data corresponds to the RF pulsing parameters (e.g., RF pulsing parameter data). The machine learning model is trained with target output data including historical RF signal spike region data. In some embodiments, the historical RF signal spike region data corresponds to regions of one or more historical multi-level RF pulse waveforms detected within a processing chamber associated with an RF signal spike of the one or more historical multi-level RF pulse waveforms. The training data input to the machine learning model is mapped to the training target output. The machine learning model is trained to identify one or more regions of the multi-level RF pulse waveform (e.g., indicated by the sensor data) that are associated with an RF signal spike (e.g., of the multi-level RF pulse waveform). In some embodiments, the machine learning model is trained to output RF signal spike region data (e.g., one or more locations or magnitudes of one or more peaks associated with an RF signal spike).

In some embodiments, more than one machine learning model can be parts of a single compound machine learning model. In this case, training one component of this compound model may involve receiving output from another component of the model as training input to the component of the model to be trained.

At block 516, the machine learning model can be retrained, using additional data. The machine learning model can be retrained with data input including the sensor data and RF pulsing parameter data (e.g., RF pulsing parameters). The machine learning model can be retrained with target output data including RF signal spike region data. The machine learning model can be retrained to further identify one or more regions in a future multi-level RF pulse waveform that are associated with an RF signal spike of the multi-level RF pulse waveform. In some embodiments, the machine learning model can be continually trained to account for drift in the manufacturing equipment, sensors, metrology equipment, etc., or to reflect changes to procedures or recipes, etc.

FIG. 5C is a method 500C for using a trained machine learning model (e.g., model 190 of FIG. 1) to detect RF peaks in a detected multi-level RF pulse waveform, according to aspects of the present disclosure.

Referring to FIG. 5C, at block 520 of method 500C, the processing logic pulses an RF signal within a processing chamber in accordance with a set of RF pulsing parameters. In some embodiments, the processing logic causes an RF signal to be pulsed (e.g., by one or more RF signal generators) based on the set of RF pulsing parameters.

At block 522, the processing logic receives sensor data indicative of a multi-level RF pulse waveform detected within the processing chamber. The multi-level RF pulse waveform is based on the RF signal pulsing. The sensor data type may correspond to that provided in block 514 of FIG. 5B to train the machine learning model.

At block 522, the processing logic receives, from one or more sensors associated with the processing chamber, sensor data indicating a multi-level RF pulse waveform detected by the one or more sensors within the processing chamber, the multi-level RF pulse waveform based on the RF signal pulsing. In some embodiments, the sensor data indicates an OFS waveform (e.g., OFS waveform of FIG. 4).

At block 524, the processing logic provides the sensor data and the set of RF pulsing parameters as input to a trained machine learning model (e.g., model 190 of FIG. 1). The machine learning model can be trained in accordance with embodiments described with respect to FIGS. 5A and 5B. For example, the machine learning model is trained to predict one or more regions of a respective multi-level RF pulse waveform that are associated with an RF signal spike, as described above. In another example, the machine learning model is trained to predict one or more peak locations of the multi-level RF pulse waveform data, the one or more peak locations corresponding to one or more regions associated with an RF signal spike, as described above.

At block 526, the processing logic obtains one or more outputs of the machine learning model. In some embodiments, the one or more outputs of the machine learning model indicate one or more regions of the multi-level RF pulse waveform detected in the processing chamber associated with an RF signal spike (e.g., of the RF signal pulsing). In some embodiments, the one or more outputs of the machine learning model indicate one or more peaks of the multi-level RF pulse waveform detected in the processing chamber.

At block 528, the processing logic extracts RF signal spike data from the one or more obtained outputs of the machine learning model. In some embodiments, the RF signal spike data is indicative of one or more regions of the detected multi-level RF pulse waveform that include RF signal spikes. In some embodiments, one or more peaks in the detected multi-level RF pulse waveform correspond to the one or more regions indicated by the RF signal spike data that include the RF signal spikes (e.g., one or more local maxima of the spike signal of FIG. 4). In some embodiments, the one or more regions of the detected multi-level pulse waveform indicate an RF signal spike corresponding to a transition of the RF signal within the processing chamber from a first state to a second state. In some embodiments, each respective region of the one or more regions corresponds to a respective peak of the one or more peaks of the multi-level RF pulse waveform.

Figure 6:
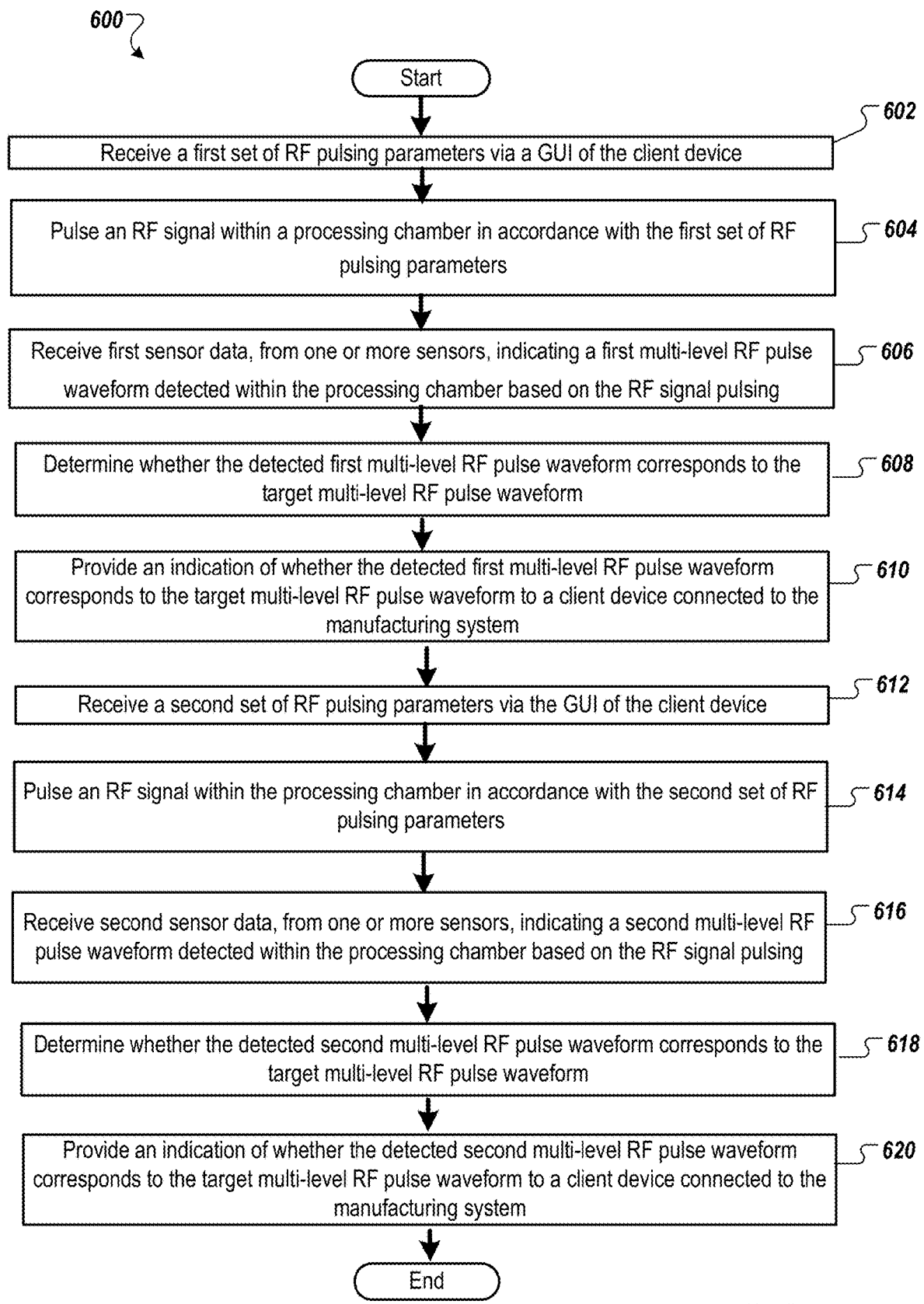
FIG. 6 is a flow diagram of a method for updating a set of RF pulsing parameters, according to aspects of the present disclosure.

FIG. 6 is a flow diagram of a method for updating a set of RF pulsing parameters, according to aspects of the present disclosure. Method 600 can be performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 600 is performed, in part, by RF signal engine 122 (e.g., residing at system controller device 121 and/or client device 120, as described with respect to FIG. 1). In other or similar embodiments, method 600 is performed, in part, by a predictive system (e.g., predictive system 110). In some embodiments, a non-transitory storage medium stores instructions that when executed by a processing device (e.g., predictive system 110, RF signal engine 122, etc.) cause the processing device to perform method 600. In some embodiments, the storage medium is a non-transitory machine-readable storage medium storing instructions that when executed by a processing device (e.g., predictive system 110, RF signal engine 122, etc.) cause the processing device to perform method 600.

For simplicity of explanation, method 600 is depicted and described as a series of operations. However, operations in accordance with this disclosure can occur in various orders and/or concurrently and with other operations not presented and described herein. Furthermore, in some embodiments, not all illustrated operations are be performed to implement method 600 in accordance with the disclosed subject matter. In addition, those skilled in the art will understand and appreciate that method 600 could alternatively be represented as a series of interrelated states via a state diagram or events.

Referring to FIG. 6, a flow diagram of a method 600 (e.g., process sequence for updating a set of RF pulsing parameters) for substrate processing equipment (e.g., a processing chamber, manufacturing equipment 124 of FIG. 1), according to certain embodiments is shown.

At block 602 of method 600, processing logic receives a first set of RF pulsing parameters. In some embodiments, the first pulsing parameters can be provided via a GUI of the client device (e.g., client device 120 of FIG. 1). The processing logic can receive the first set of RF pulsing parameters from the client device (e.g., via a network). The first pulsing parameters can correspond to a target multi-level RF pulse waveform of a process operation. For example, a user may specify the first pulsing parameters, via a GUI of the client device, based on the target multi-level RF pulse waveform.

At block 604, the processing logic pulses an RF signal within a processing chamber in according with the first set of RF pulsing parameters. In some embodiments, the system controller can provide the first pulsing parameters to a plurality of RF signal generators. The RF signal generators may emit an RF signal based on the first pulsing parameters, in accordance with previously described embodiments.

At block 606, the processing logic receives first sensor data, from one or more sensors (e.g., an OFS), indicating a first multi-level RF pulse waveform detected within the processing chamber. The first detected multi-level RF pulse waveform may be based on the RF signal pulsing based on the first set of RF pulsing parameters. The first detected multi-level RF pulse waveform can be associated with a first substrate process.

At block 608, the processing logic determines whether the detected first multi-level RF pulse waveform corresponds to the target multi-level RF pulse waveform. In some embodiments, the processing logic determines whether the detected first multi-level RF pulse waveform sufficiently matches (e.g., approximately matches) the target multi-level RF pulse waveform (e.g., within a predetermined threshold). In some embodiments, the client device receives data associated with one or more peak locations of the target multi-level RF pulse waveform.

At block 610, the processing logic provides an indication of whether the detected first multi-level RF pulse waveform corresponds to the target multi-level RF pulse waveform to a client device (e.g., client device 120 of FIG. 1) connected to the manufacturing system.

At block 612, the processing logic receives a second set of RF pulsing parameters. The client device can receive the second set of RF pulsing parameters via the GUI of the client device. The system controller can receive the second set of RF pulsing parameters from the client device (i.e., via the network). In some embodiments, one or more of the second RF pulsing parameters can be different from one or more of the first RF pulsing parameters. For example, a second frequency parameter may differ from a first frequency parameter. In some embodiments, the user adjusts one or more first RF pulsing parameters based on peak data associated with the first multi-level RF pulse waveform. One or more adjustments to one or more first RF pulsing parameters may be reflected in the second set of RF pulsing parameters. In some embodiments, the client device can receive an indication of one or more suggestions associated with the RF pulsing parameters that would cause a future multi-level RF pulse waveform to correspond to the target multi-level RF pulse waveform. In some embodiments, the user may specify the second set of RF pulsing parameters based on data associated with one or more peak locations of the target multi-level RF pulse waveform received by the client device.

At block 614, processing logic pulses an RF signal within the processing chamber in accordance with the second set of RF pulsing parameters. In some embodiments, the processing logic provides the second pulsing parameters to the plurality of RF signal generators. The RF signal generators may emit an RF signal based on the second pulsing parameters.

At block 616, the processing logic receives second sensor data, from one or more sensors (e.g., an OFS), indicating a second multi-level RF pulse waveform detected within the processing chamber. The second detected multi-level RF pulse waveform may be based on the RF signal pulsing based on the second set of RF pulsing parameters. The second detected multi-level RF pulse waveform may be associated with a second substrate process.

At block 618, the processing logic determines whether the detected second multi-level RF pulse waveform corresponds to the target multi-level RF pulse waveform. In some embodiments, the processing logic determines whether the detected second multi-level RF pulse waveform sufficiently matches (e.g., approximately matches) the target multi-level RF pulse waveform (e.g., within a predetermined threshold).

At block 620, the processing logic provides an indication of whether the detected second multi-level RF pulse waveform corresponds to the target multi-level RF pulse waveform to a client device (e.g., client device 120 of FIG. 1) connected to the manufacturing system. In some embodiments, blocks 612-620 are repeated until a detected future multi-level RF pulse waveform corresponds with the target multi-level pulse waveform.

Figure 7:
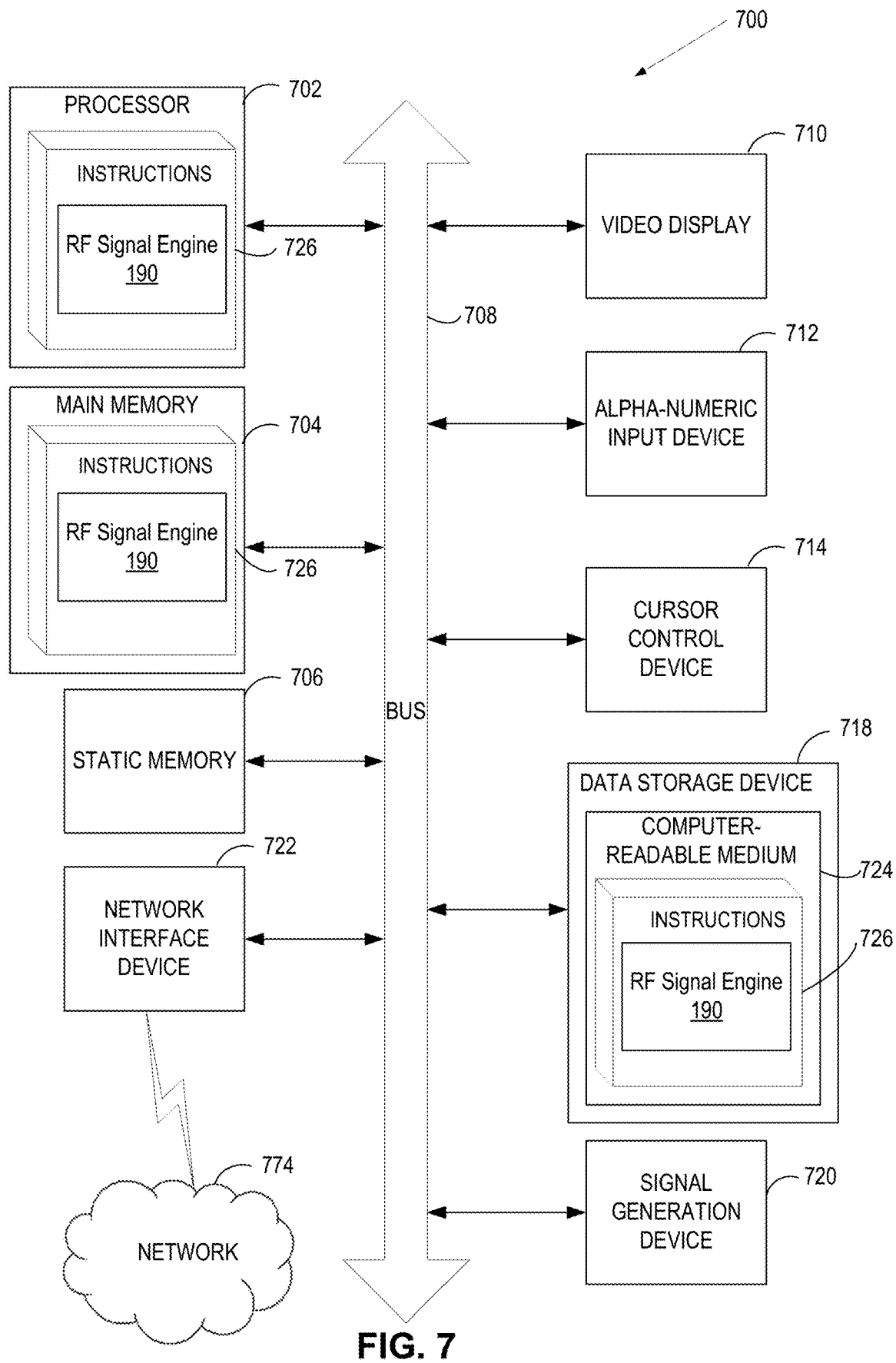
FIG. 7 is a block diagram illustrating a computer system, according to aspects of the present disclosure.

FIG. 7 is a block diagram illustrating a computer system 700, according to aspects of the present disclosure. In some embodiments, the computer system 700 is the client device 120 (e.g., of FIG. 1). In some embodiments, the computer system 700 is a controller device (e.g., server).

In some embodiments, computer system 700 is connected (e.g., via a network, such as a Local Area Network (LAN), an intranet, an extranet, or the Internet) to other computer systems. Computer system 700 operates in the capacity of a server or a client computer in a client-server environment, or as a peer computer in a peer-to-peer or distributed network environment. In some embodiments, computer system 700 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In some embodiments, the computer system 700 includes a processor 702, a volatile memory 704 (e.g., Random Access Memory (RAM)), a non-volatile memory 706 (e.g., Read-Only Memory (ROM) or Electrically-Erasable Programmable ROM (EEPROM)), and/or a data storage device 716, which communicates with each other via a bus 708.

In some embodiments, processor 702 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor). In some embodiments, processor 702 is provided by one or more of a single processor, multiple processors, a single processor having multiple processing cores, and/or the like.

In some embodiments, computer system 700 further includes a network interface device 722 (e.g., coupled to network 774). In some embodiments, the computer system 700 includes one or more input/output (I/O) devices. In some embodiments, computer system 700 also includes a video display unit 710 (e.g., an LCD), an alphanumeric input device 712 (e.g., a keyboard), a cursor control device 714 (e.g., a mouse), and/or a signal generation device 720.

In some implementations, data storage device 718 (e.g., disk drive storage, fixed and/or removable storage devices, fixed disk drive, removable memory card, optical storage, network attached storage (NAS), and/or storage area-network (SAN)) includes a non-transitory computer-readable storage medium 724 on which stores instructions 726 encoding any one or more of the methods or functions described herein, including instructions encoding components of FIG. 1 (e.g., RF signal engine 122, etc.) and for implementing methods described herein. In some embodiments, the processor 702 includes RF signal engine 122. In some embodiments, peak data, multi-level RF pulse waveform data, and/or RF pulsing parameter data is stored in data storage device 718.

In some embodiments, instructions 726 also reside, completely or partially, within volatile memory 704 and/or within processor 702 during execution thereof by computer system 700, hence, volatile memory 704 and processor 702 also constitute machine-readable storage media, in some embodiments.

While computer-readable storage medium 724 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. Further, the methods, components, and features are implemented in any combination of hardware devices and computer program components, or in computer programs.

Unless specifically stated otherwise, terms such as "identifying," "calculating," "determining," "applying," "obtaining," "causing," "receiving," "pulsing," "providing," "generating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. Such a computer program is stored in a computer-readable tangible storage medium.

The methods and illustrative examples described herein are not inherently related to any particular computer or other apparatus. Various general purpose systems are used in accordance with the teachings described herein, or, in some embodiments, it proves convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving, from one or more sensors associated with a processing chamber, sensor data indicative of a radio frequency (RF) pulse waveform detected within the processing chamber;
   identifying one or more RF signal characteristics in the detected RF pulse waveform, wherein each of the identified one or more RF signal characteristics corresponds to at least one RF signal pulse of an RF signal pulsing within the processing chamber;
   determining, based on the identified one or more RF signal characteristics, whether the detected RF pulse waveform corresponds to a target RF pulse waveform; and
   providing, to a client device associated with the processing chamber, an indication of whether the detected RF pulse waveform corresponds to the target RF pulse waveform.

2. The method of claim 1, wherein identifying the one or more RF signal characteristics in the detected RF pulse waveform comprises:
   identifying one or more regions of the detected RF pulse waveform that are associated with an RF signal characteristic of the one or more RF signal characteristics.

3. The method of claim 2, wherein the RF signal characteristic corresponds to a pulse of the RF signal within the processing chamber between a first state and a second state, and wherein each respective region of the one or more identified regions corresponds to a respective RF signal characteristic of the identified one or more RF signal characteristics.

4. The method of claim 2, wherein determining whether the detected RF pulse waveform corresponds to the target RF pulse waveform comprises:
  determining whether at least one of a location or a magnitude of a respective identified region of the detected RF pulse waveform corresponds to at least one of a target location or a target magnitude of a target signal characteristic region of the target RF pulse waveform; and
  responsive to determining that the at least one of the location or the magnitude of the respective identified region corresponds to the at least one of the target location or the target magnitude of the target signal characteristic region, determining that the detected RF pulse waveform corresponds to the target RF pulse waveform.

5. The method of claim 2, wherein identifying the one or more RF signal characteristics in the detected RF pulse waveform further comprises:
  applying one or more data transform operations to the sensor data to obtain transformed RF pulse waveform data, wherein the data transform operations amplify an intensity of one or more RF signal characteristics associated with the detected RF pulse waveform, and wherein the one or more regions associated with the RF signal characteristic are identified based on the transformed RF pulse waveform.

6. The method of claim 1, wherein identifying the one or more RF signal characteristics in the detected RF pulse waveform comprises:
  providing the sensor data as input to a machine learning model trained to predict one or more regions of a respective RF pulse waveform that are associated with an RF signal characteristic;
  obtaining one or more outputs of the machine learning model; and
  extracting, from the one or more obtained outputs, RF signal characteristic data.

7. The method of claim 6, wherein the RF signal characteristic data indicates one or more regions of the detected RF pulse waveform that include RF signal characteristics, and wherein the one or more RF signal characteristics in the detected RF pulse waveform correspond to the one or more regions indicated by the RF signal characteristic data that include the RF signal characteristics.

8. The method of claim 1, wherein the one or more sensors associated with the processing chamber include an optical frequency sensor (OFS).

9. A non-transitory machine-readable storage medium storing instructions which, when executed, cause a processing device to:
  receive, from one or more sensors associated with a processing chamber, sensor data indicative of a radio frequency (RF) pulse waveform detected within the processing chamber;
  identify one or more RF signal characteristics in the detected RF pulse waveform, wherein each of the identified one or more RF signal characteristics corresponds to at least one RF signal pulse of an RF signal pulsing within the processing chamber;
  determine, based on the identified one or more RF signal characteristics, whether the detected RF pulse waveform corresponds to a target RF pulse waveform; and
  provide, to a client device associated with the processing chamber, an indication of whether the detected RF pulse waveform corresponds to the target RF pulse waveform.

10. The non-transitory machine-readable storage medium of claim 9, wherein identifying the one or more RF signal characteristics in the detected RF pulse waveform comprises:
  identifying one or more regions of the detected RF pulse waveform that are associated with an RF signal characteristic of the one or more RF signal characteristics.

11. The non-transitory machine-readable storage medium of claim 10, wherein the RF signal characteristic corresponds to a pulse of the RF signal within the processing chamber between a first state and a second state, and wherein each respective region of the one or more identified regions corresponds to a respective RF signal characteristic of the identified one or more RF signal characteristics.

12. The non-transitory machine-readable storage medium of claim 10, wherein determining whether the detected RF pulse waveform corresponds to the target RF pulse waveform comprises:
  determining whether at least one of a location or a magnitude of a respective identified region of the detected RF pulse waveform corresponds to at least one of a target location or a target magnitude to a target signal characteristic region of the target RF pulse waveform; and
  responsive to determining that the at least one of the location or the magnitude of the respective identified region corresponds to the at least one of the target location or the target magnitude of the target signal characteristic region, determining that the detected RF pulse waveform corresponds to the target RF pulse waveform.

13. The non-transitory machine-readable storage medium of claim 10, wherein identifying the one or more RF signal characteristics in the detected RF pulse waveform further comprises:
  applying one or more data transform operations to the sensor data to obtain transformed RF pulse waveform data, wherein the data transform operations amplify an intensity of one or more RF signal characteristics associated with the detected RF pulse waveform, and wherein the one or more regions associated with the RF signal characteristic are identified based on the transformed RF pulse waveform.

14. The non-transitory machine-readable storage medium of claim 9, wherein identifying the one or more RF signal characteristics in the detected RF pulse waveform comprises:
  providing the sensor data as input to a machine learning model trained to predict one or more regions of a respective RF pulse waveform that are associated with an RF signal characteristic;
  obtaining one or more outputs of the machine learning model; and
  extracting, from the one or more obtained outputs, RF signal characteristic data.

15. The non-transitory machine-readable storage medium of claim 14, wherein the RF signal characteristic data indicates one or more regions of the detected RF pulse waveform that include RF signal characteristics, and wherein the one or more RF signal characteristics in the detected RF pulse waveform correspond to the one or more regions indicated by the RF signal characteristic data that include the RF signal characteristics.

16. A system comprising:
a memory; and
a processing device coupled to the memory, the processing device to:
receive, from one or more sensors associated with a processing chamber, sensor data indicative of a radio frequency (RF) pulse waveform detected within the processing chamber;
identify one or more RF signal characteristics in the detected RF pulse waveform, wherein each of the identified one or more RF signal characteristics corresponds to at least one RF signal pulse of an RF signal pulsing within the processing chamber;
determine, based on the identified one or more RF signal characteristics, whether the detected RF pulse waveform corresponds to a target RF pulse waveform; and
provide, to a client device associated with the processing chamber, an indication of whether the detected RF pulse waveform corresponds to the target RF pulse waveform.

17. The system of claim 16, wherein identifying the one or more RF signal characteristics in the detected RF pulse waveform comprises:
identifying one or more regions of the detected RF pulse waveform that are associated with an RF signal characteristic of the one or more RF signal characteristics, wherein the RF signal characteristic corresponds to a pulse of the RF signal within the processing chamber between a first state and a second state, and wherein each respective region of the one or more identified regions corresponds to a respective RF signal characteristic of the identified one or more RF signal characteristics.

18. The system of claim 17, wherein determining whether the detected RF pulse waveform corresponds to the target RF pulse waveform comprises:
determining whether at least one of a location or a magnitude of a respective identified region of the detected RF pulse waveform corresponds to at least one of a target location or a target magnitude to a target signal characteristic region of the target RF pulse waveform; and
responsive to determining that the at least one of the location or the magnitude of the respective identified region corresponds to the at least one of the target location or the target magnitude of the target signal characteristic region, determining that the detected RF pulse waveform corresponds to the target RF pulse waveform.

19. The system of claim 17, wherein identifying the one or more RF signal characteristics in the detected RF pulse waveform further comprises:
applying one or more data transform operations to the sensor data to obtain transformed RF pulse waveform data, wherein the data transform operations amplify an intensity of one or more RF signal characteristics associated with the detected RF pulse waveform, and wherein the one or more regions associated with the RF signal characteristic are identified based on the transformed RF pulse waveform.

20. The system of claim 16, wherein identifying the one or more RF signal characteristics in the detected RF pulse waveform comprises:
providing the sensor data as input to a machine learning model trained to predict one or more regions of a respective RF pulse waveform that are associated with an RF signal characteristic;
obtaining one or more outputs of the machine learning model; and
extracting, from the one or more obtained outputs, RF signal characteristic data.

* * * * *